United States Patent [19]

Shigeta

[11] Patent Number: 5,338,627
[45] Date of Patent: Aug. 16, 1994

[54] METHOD FOR MANUFACTURING ROTARY SCREEN

[75] Inventor: Tatsuo Shigeta, Chiba, Japan

[73] Assignee: Think Laboratory Co., Ltd., Chiba, Japan

[21] Appl. No.: 887,094

[22] Filed: May 22, 1992

[51] Int. Cl.$^5$ ............................................... G03F 9/00
[52] U.S. Cl. ............................................. 430/6; 430/7
[58] Field of Search ................... 430/6, 396, 945, 397; 101/132

[56] References Cited

U.S. PATENT DOCUMENTS 3,981,237  9/1976  Rhodes ............................ 156/73.4
4,251,625  2/1981  Sakamoto et al. ................... 430/6

*Primary Examiner*—Steve Rosasco
*Attorney, Agent, or Firm*—Koda and Androlia

[57] ABSTRACT

A method of manufacturing a rotary halftone screen which has no slit or meshless portion by the use of galvano process including a step of exposing the roll coated with high-sensitivity photosensitive film by a multiple number of laser beams. The multiple number of laser beams are controlled by preset electric data so that desired halftone points of negative halftone image are exposed on the roll.

5 Claims, 4 Drawing Sheets

Direction of the laser scanning

Direction of the roll scanning

Direction of the roll scanning

Direction of the formation of dots

Direction of the laser scanning (a)

0.2~0.3mm

Direction of the circumference

Lap

METHOD FOR MANUFACTURING ROTARY SCREEN

BACKGROUND OF THE INVENTION

1. Field of the Invention

The present invention relates to a method of manufacturing a rotary screen and specifically to a rotary screen manufacturing method using a galvano process by which a rotary halftone screen with no slit or meshless portion is obtained.

2. Prior Art

FIG. 3(a) shows a conventional rotary halftone screen which is made of nickel and approximately 1 mm in thickness. The rotary halftone screen S has halftone meshes and a linear meshless portion G that is 0.2 to 0.3 mm in width and extends along the entire length of the halftone screen surface.

As shown in FIG. 3(b) and 3(c), the shape of the halftone meshes is, for example, a regular hexagonal (a) or a regular square (b), and the halftone meshes are arranged in regular rows.

When a printing is performed, ink is supplied from the inside of the rotary halftone screen S to the outer surface of the rotary halftone screen by wiping the inside surface of the rotary halftone screen S with an internal doctor so that ink is squeezed out through the meshes. The number of the rows of the halftone meshes is generally 60, 80, 100 or 120 per inch.

In manufacturing rotary halftone screens, there are a lacquer method, a galvano method and an etching method. Among these methods, the galvano method will be described with reference to FIGS. 3(d) through 4(e).

First, as shown in FIG. 3(d), a roll 1, which has surface properties that allow easy stripping of a nickel plating, is coated with a photosensitive film 2. A photo resist film 3 is laid over the photosensitive film 2, and the photosensitive film 2 is exposed by a UV light source 4. As a result, a negative halftone image 5 is made on the roll 1 as shown in FIG. 3(e). Afterward, the roll is plated by nickel so that the nickel 6 is filled in grooves of the halftone image as shown in FIG. 3(f).

The halftone meshes are made by the process described above, and in order to obtain the rotary halftone meshes, following steps are taken.

First, as shown in FIG. 4(a), the roll 1, that is coated with a photosensitive film, is held by a pair of chucks 7 of an exposure apparatus, and one end of the photo resist film 3 is fastened on the surface of the roll 1 by a transparent adhesive tape 8. Afterward, a first masking tape is fastened on the transparent adhesive tape 8 and the roll 1 so that the edge of the first masking tape 9 is accurately aligned with the edge of the photo resist film 3.

Next, as shown in FIG. 4(b), the second stage of the exposure process is performed. After the masking tape 9 is positioned under the UV light source 4, the LrV light source 4 is turned on, and the roll 1 is rotated in the direction indicated by arrow X. An exposure treatment is thus started.

FIG. 4(c) illustrates the third stage of the exposure process. After a prescribed period of time has elapsed, the UV light source is turned off, and a second masking tape 10 is carefully applied so that the edge of the second masking tape 10 is overlapped 0.2 to 0.3 mm from the edge of the masking tape 9.

FIG. 4(d) illustrates the fourth stage of the exposure process. After the second masking tape 10 is applied, the first masking tape 9 is stripped away, and the other end of the photo resist film 3 is fastened by an adhesive tape 11 on the second masking tape 10.

After the photosensitive film is rounded on the entire surface of the roll 1, the UV light source is turned on and the roll is rotated in the direction indicated by arrow X until the second masking tape 10 is positioned under the UV light source 4 as shown in FIG. 4(e). Then, the UV light source is turned off, and the exposure treatment is thus completed.

In the conventional method of manufacturing rotary screens using a galvano process as described above, it is necessary to provide a 0.2 to 0.3 mm overlap of the second masking tape 10 over the first masking tapes 9 so as to make the rotary halftone screen. If the overlap is not provided between the two masking tapes 9 and 10, the both ends of the photo resist film 3 are overlapped as shown in FIG. 5(b). Therefore, a groove on the photosensitive film cannot be formed between the both ends of the photo resist film. In other words, the grooves that are filled with the nickel plating are not formed along the entire length of the roll 1. As a result, rents C are formed in places along the entire length of the halftone screen is not formed as a round shape.

On the other hand, the rotary halftone screen made by the conventional method has a meshless portion that corresponds to the gap as shown in FIG. 5(a). Accordingly, it is impossible to print continuous patterns since ink is not supplied from the meshless portion. If it is desired to print continuous patterns, the holes (a) positioned along the meshless portion is retouched by skilled workers so as to enlarge the holes (a).

Therefore, to make the rotary halftone screen used for continuous printing patterns requires considerable time and labor.

SUMMARY OF THE INVENTION

Accordingly, the object of the present invention is to provide a method of manufacturing rotary screens using a galvano process which forms a rotary screen with no meshless portion by a simple operation.

In order to achieve the object, the present invention uses a unique method of manufacturing rotary screens in which (a) a roll coated with a high-sensitivity photosensitive film is supported at the both ends to undergo a rotary scanning motion, (b) a multiple number of laser beams arranged in a prescribed manner are caused to scan the length of the roll surface while the laser beams are intermittently driven on the basis of electronic data representing a desired halftone image, so that halftone points of the halftone image are subjected to an endless laser exposure by the laser beams, (c) a negative halftone image in which the halftone points remain is formed by subsequent development, (d) the other areas surrounding the negative halftone image portions are filled with nickel by a nickel plating process, and (e) the rotary halftone screen is peeled off from the roll.

DETAILED DESCRIPTION OF THE INVENTION

An embodiment of the method of the present invention for manufacturing rotary screens will be described with reference to FIG. 1, FIG. 2(a) and 2(b).

First, a high-sensitivity photosensitive agent (polymer), which reacts to an argon ion laser with a wavelength of 488 nanometers, is coated on a roll 1 so that the photosensitive agent is formed with a uniform thickness. The roll 1 has surface properties in which a nickel plating can easily be peeled off from the roll 1. Thus, the roll 1 is, for example, a stainless steel roll, a nickel roll with an oxide coating, or a cooper roll with an organic film.

After the photosensitive agent is dried, a transparent protective film, for example, polyvinyl alcohol, is coated on the photosensitive agent so as to prevent the photosensitive film from being oxidized since the photosensitive film tends to be easily oxidized and the photosensitive film loses its photosensitivity when the photosensitive film is oxidized.

Figure 1:
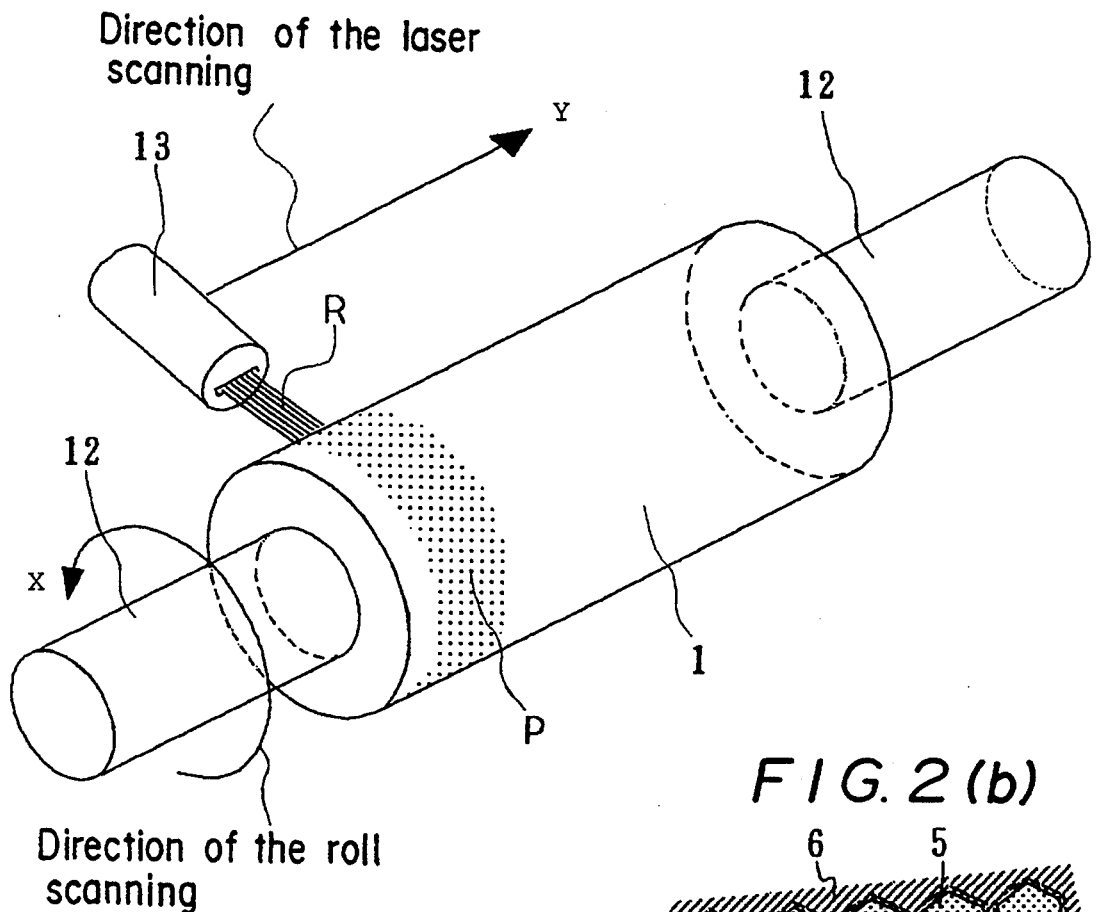
FIG. 1 is a perspective view which illustrates the laser exposure process of the present invention.
Figure 2B:
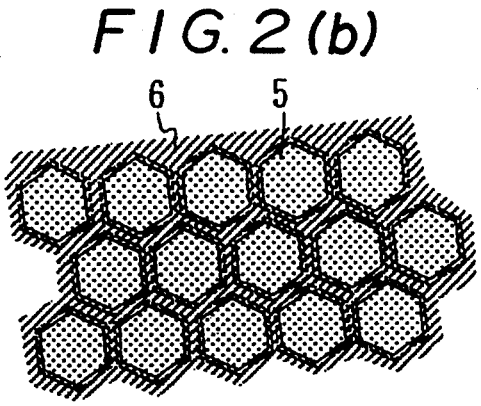
FIG. 2(b) is an enlarged view of the surface of the roll following the completion of the nickel plating process.
Figure 2A:
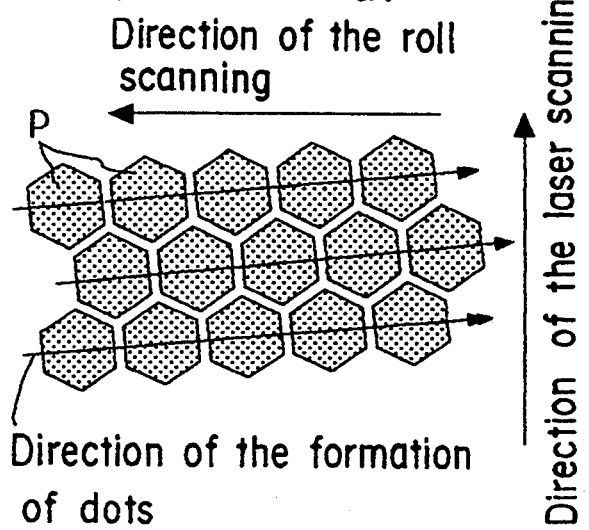
FIG. 2(a) is an enlarged view which illustrates the arrangement and exposure of the halftone points in the laser exposure process of the method of the present invention.

Next, as shown in FIG. 1, the roll 1 is held at both ends by chucks 12 installed on a laser exposure apparatus, and the roll 1 is rotated in the direction indicated by arrow X. Afterward, a plurality of argon ion laser beams R with a wavelength of 488 nanometers, that are arranged in a straight chain arrangement, are emitted from a laser head 13 of the laser exposure apparatus to the surface of the roll 1, and the laser head 13 is scanned in the direction indicated by arrow Y. An emission of the argon ion laser beams R is controlled by electronic data for making a desired halftone image. As a result, the roll 1 is exposed by the argon ion laser such that regular hexagonal halftone points P are formed in a regular row and in spiral pattern on the surface of the roll 1 as shown in FIG. 2(a).

In addition, the electronic data for controlling the emission of the argon ion laser beams R is predetermined in view of the circumference of the roll 1 and the size of the hexagonal halftone points P so that the regular hexagonal halftone points P are formed evenly for the entire surface of the roll 1.

Figure 3A:
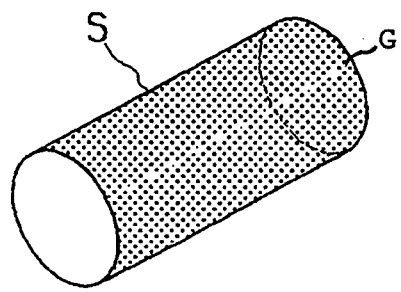
FIG. 3(a) is a perspective view of a rotary screen manufactured by a conventional galvano process.
Figure 3B:
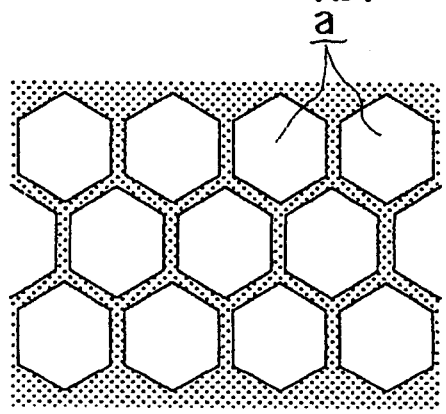
FIGS. 3(b) and 3(c) are enlarged views which illustrate the halftone meshes.
Figure 3C:
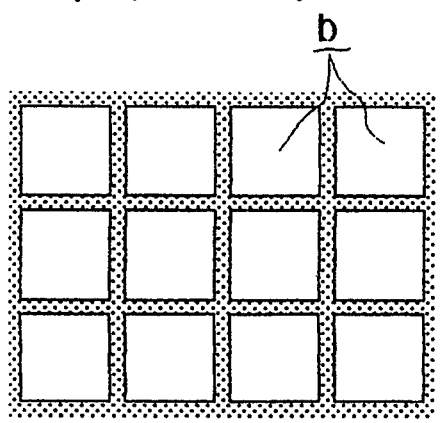
Figure 3D:
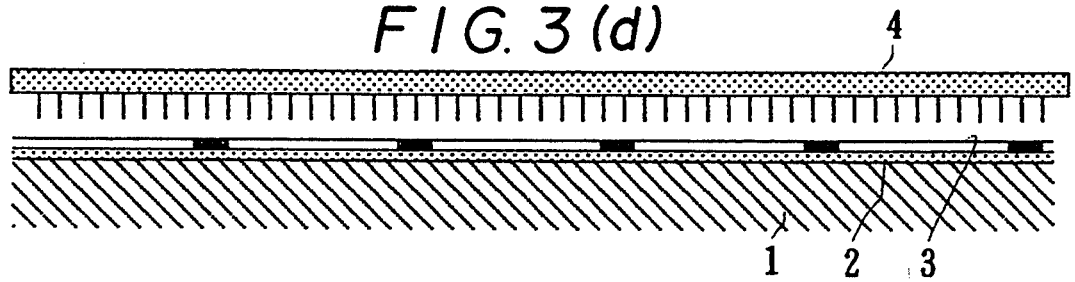
FIG. 3(d) is an enlarged cross sectional view which illustrates the exposure process in a conventional method.
Figure 3E:
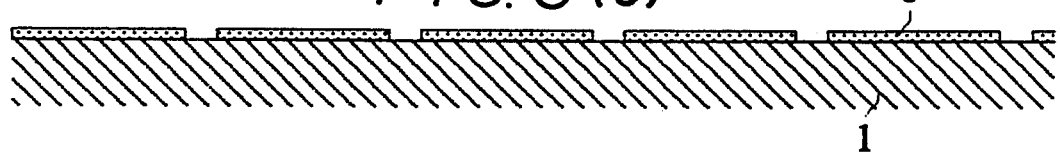
FIG. 3(e) is an enlarged cross sectional view which illustrates the roll surface following the completion of the development process in a conventional method.
Figure 3F:
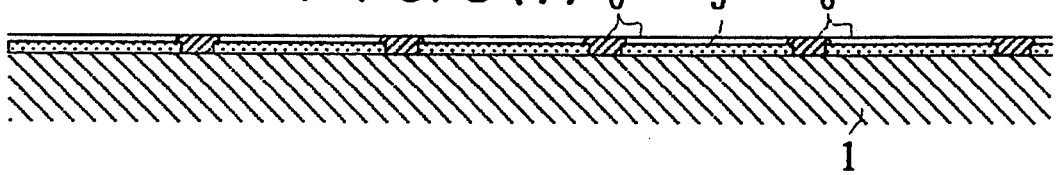
FIG. 3(f) is an enlarged view which illustrates the nickel plating process in a conventional method.
Figure 4A:
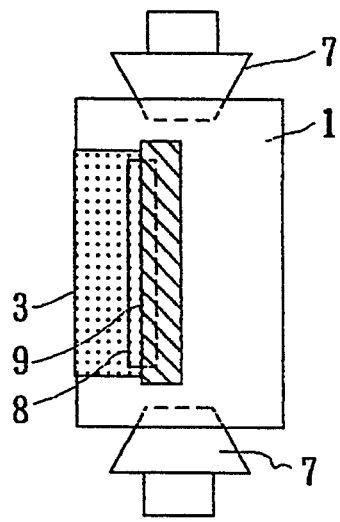
FIGS. 4(a) through 4(e) are schematic front views which illustrate the first through fifth stages of the exposure process in a conventional method of manufacturing rotary screen.
Figure 4B:
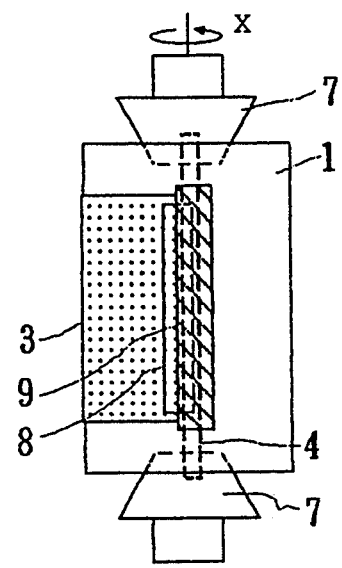
Figure 4C:
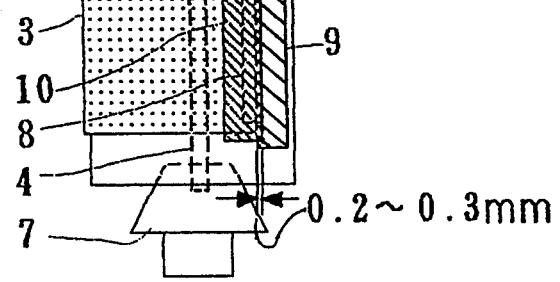
Figure 4D:
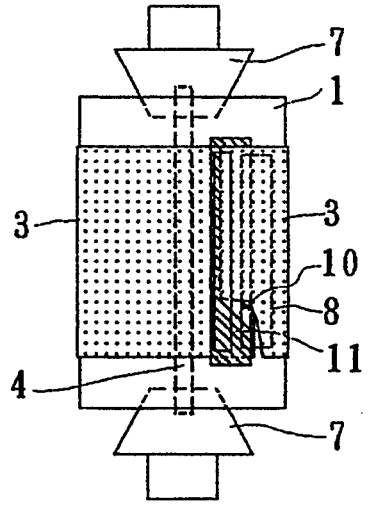
Figure 4E:
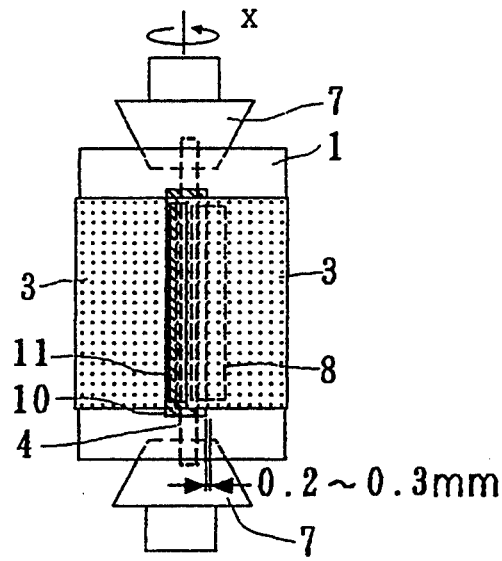
Figure 5A:
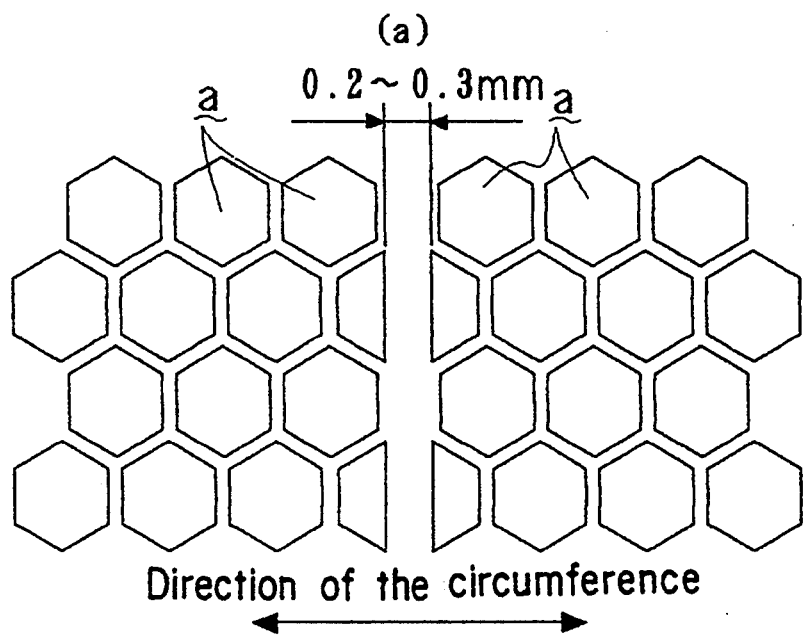
FIG. 5(a) is an enlarged view corresponding to the exposure beam area of a conventional rotary screen where the beginning and end of the exposure area are separated by a gap of 0.2 to 0.3 mm.
Figure 5B:
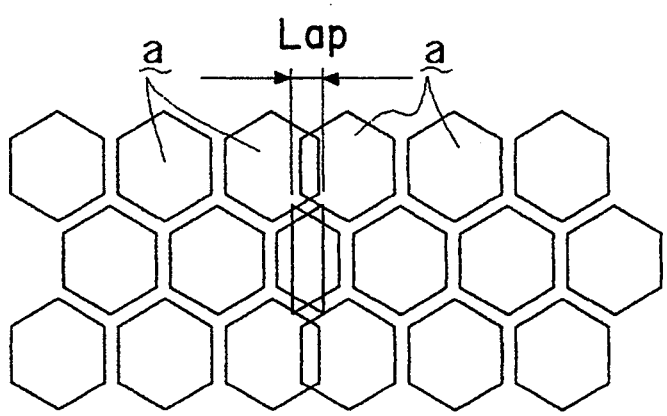
FIG. 5(b) is an enlarged view corresponding to the exposure beam area of another conventional rotary screen where the beginning and the end of the exposed area are overlapped.
Figure 5C:
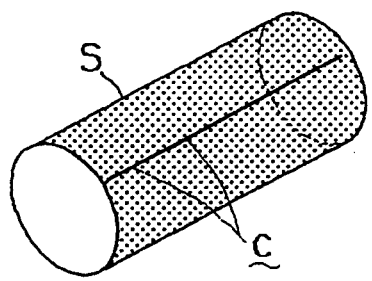
FIG. 5(c) is a perspective view of a conventional rotary screen in which the beginning and the end of the exposed area are overlapped.

Next, the roll 1 is removed from the chuck 12, and the roll 1 is immersed and rotated in a developing solution. As a result, the negative halftone image in which the halftone points P remain is developed as shown in FIG. 3(e), and the roll 1 is taken out from the developing solution.

Afterward, the roll 1 is immersed and rotated in a nickel plating solution, and an electric current is applied to the roll 1 while the roll 1 is rotated in the nickel plating solution. As a result, the nickel 6 is filled in the negative halftone images 5, and the rotary halftone screen made of nickel is formed as shown in FIG. 2(b).

After the roll 1 is taken out from the nickel plating solution, the roll 1 is held at both ends and rotated at a low speed, and the roll 1 is pressed by a soft material, so that a pressure of the soft material against the roll 1 is applied to the nickel plating in the circumferential direction. Therefore, the circumferential length of the nickel plating is slightly increased so that the nickel plating can easily be removed from the roll 1. The rotary screen is thus obtained.

As described above, the method of the present invention of manufacturing rotary screens is a method of manufacturing rotary screens using a galvano process which is designed so that an endless laser exposure is performed, thus making it possible to obtain a negative halftone image in which the halftone points are arranged in spiral oblique rows or straight rows. Accordingly, the fatal drawback of splitting of the pattern by a white line is eliminated. Furthermore, the exposure process is greatly simplified, and there are no errors resulting in the generation of rents in the screen.

I claim:

1. A method of manufacturing rotary screens comprising the steps of:
   supporting a roll coated with a high-sensitivity photosensitive film at both ends and rotating said roll at a predetermined speed;
   scanning a multiple number of laser beams arranged in a prescribed manner in the lengthwise direction of said roll while said laser beams are driven by electronic data which is preset so that desired halftone points of negative halftone image are exposed on said roll;
   developing said roll in which said negative halftone image is exposed;
   nickel plating said developed roll so that a surrounding area of said halftone points are filled with nickel; and
   removing a rotary halftone screen made of nickel from said plate roll.

2. A method of manufacturing rotary screens according to claim 1 wherein said multiple number of laser beams are produced from argon ion lasers.

3. A method according to claim 1 wherein a wavelength of said laser beams is 488 nanometers.

4. A method of manufacturing rotary screens according to claim 1 wherein said high-sensitivity photosensitive film is coded onto said roll by forming a film of photosensitive agent on said roll and providing a transparent protective film on said film photosensitive agent.

5. A method according to claim 4 wherein said transparent protective film is a polyvinyl alcohol.

* * * * *